United States Patent [19]

Tiemann et al.

[11] Patent Number: 4,584,657

[45] Date of Patent: Apr. 22, 1986

[54] CHARGE TRANSFER MULTIPLIER AND FILTER

[75] Inventors: Jerome J. Tiemann; Thomas L. Vogelsong, both of Schenectady, N.Y.

[73] Assignee: General Electric Company, Schenectady, N.Y.

[21] Appl. No.: 548,067

[22] Filed: Nov. 2, 1983

[51] Int. Cl.$^4$ ................................................ G06J 1/00
[52] U.S. Cl. ..................................... 364/602; 364/606
[58] Field of Search ............... 364/602, 606, 724, 754, 364/825, 844

[56] References Cited

U.S. PATENT DOCUMENTS

| | | | |
|---|---|---|---|
| 4,120,035 | 10/1978 | Cases et al. | 364/602 |
| 4,126,852 | 11/1978 | Baertsch | 364/606 |
| 4,161,783 | 7/1979 | Wrench, Jr. et al. | 364/606 |
| 4,316,258 | 2/1982 | Berger | 364/602 |
| 4,458,324 | 7/1984 | Burke et al. | 364/606 |

*Primary Examiner*—David H. Malzahn
*Attorney, Agent, or Firm*—Marvin Snyder; James C. Davis, Jr.

[57] ABSTRACT

The signal processing apparatus includes a plurality of multiplying or charge splitting stages connected in series. A plurality of pairs of control words are provided, one word of each pair being the complement of the other word of the pair. Each pair of words is associated with a respective multiplying stage and represents the multiplying coefficient of a respective multiplying stage. Means are provided for forming a plurality of quantities of charge, each representing a respective sample of an analog signal. Each of the quantities of charge is introduced in sequence into each of the multiplying stages in which it is processed and then passed on to the next multiplying stage. The process operation in each of the multiplying stages includes dividing the quantity of charge in a series of splitting operations under the control of the pair of words associated with the stage into two parts. All of the first parts of each of the quantities of charge in each of the stages is summed. All of the second part of each of the quantities of charge in each of the stages is summed. A signal is derived representing the difference of the two sums of charge. The two parts of each quantity of charge are combined and passed to the next multiplying stage.

7 Claims, 21 Drawing Figures

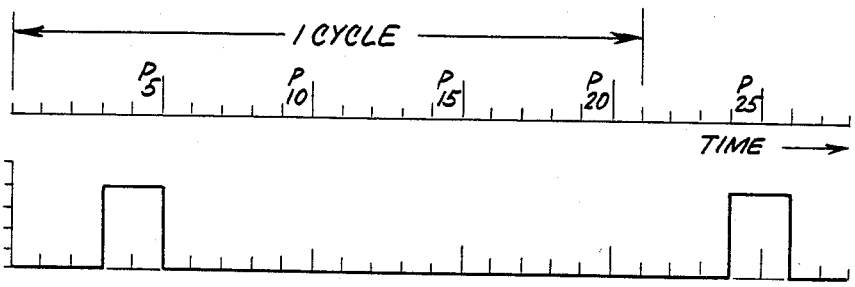
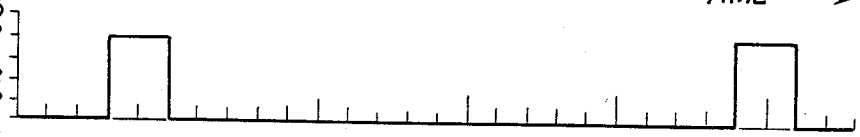
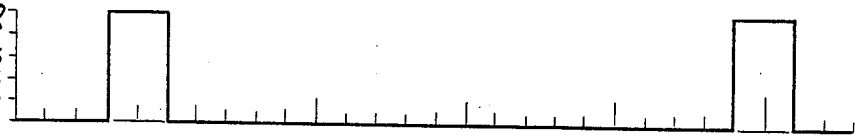
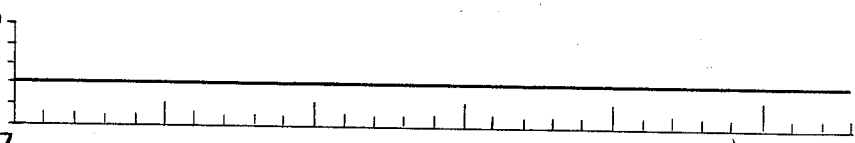
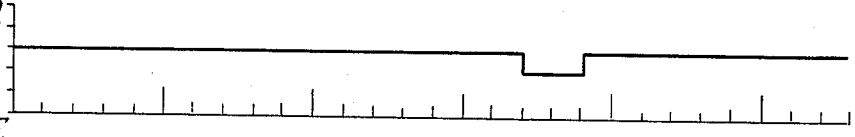
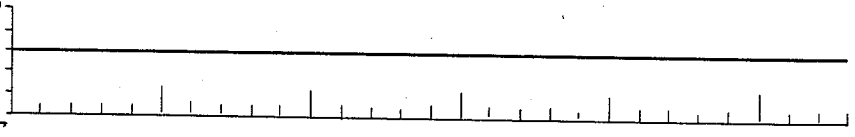
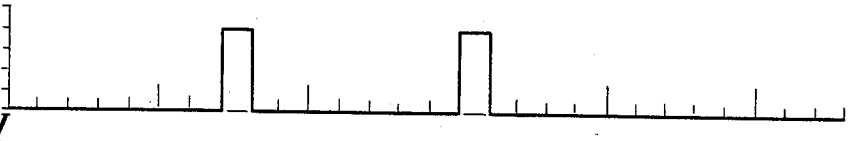
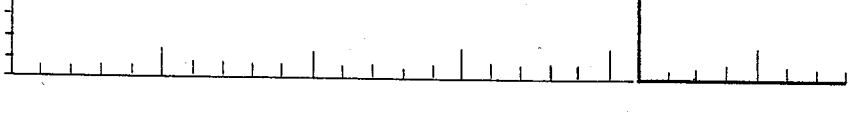

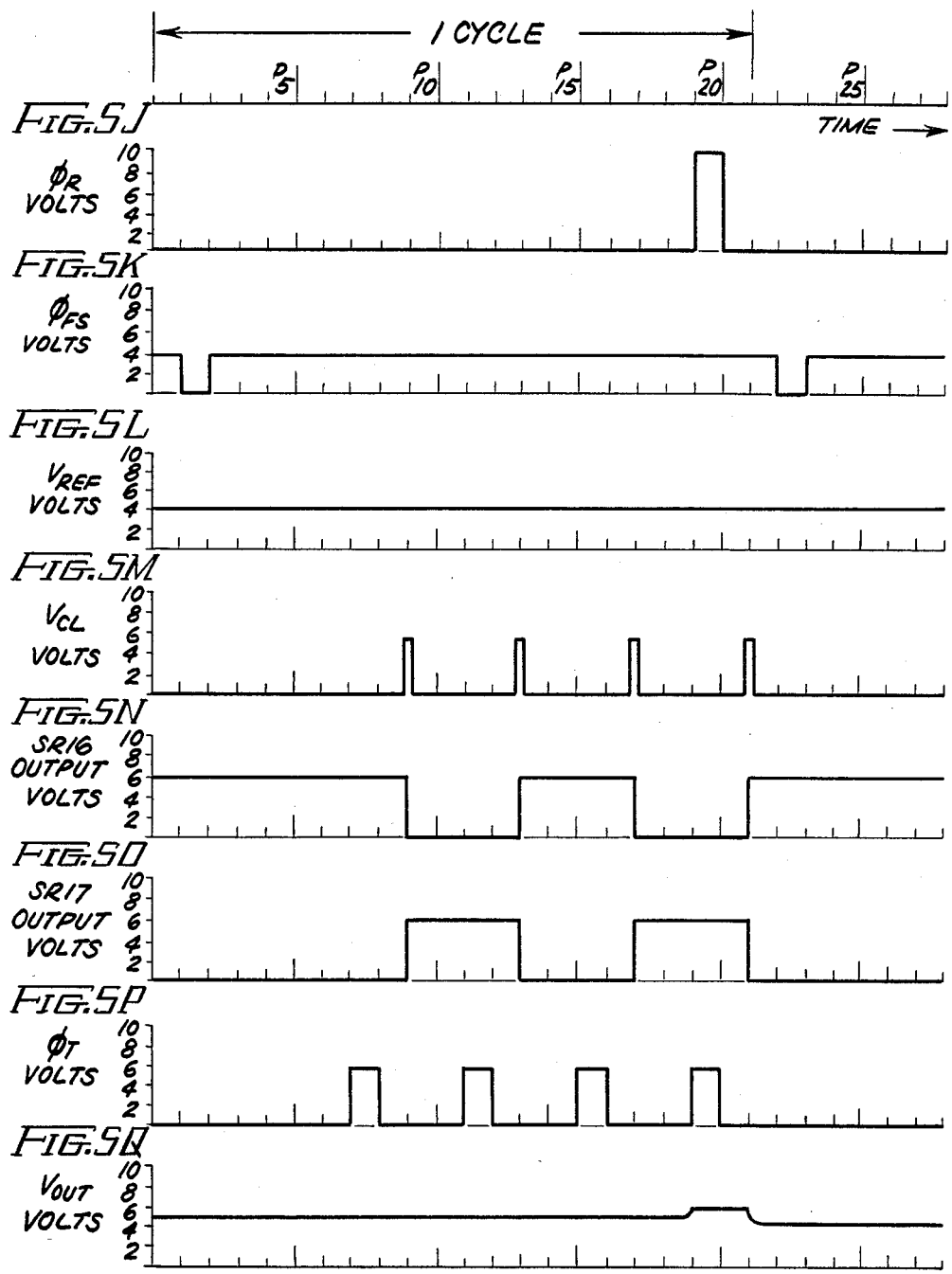

CHARGE TRANSFER MULTIPLIER AND FILTER

The present invention relates in general to signal processing apparatus comprising charge transfer devices and in particular to charge transfer transversal filters.

Conventional charge transfer filters have had fixed tap weights which are fixed by photolithographic masks used in fabrication thereof. This means that an entirely new filter must be fabricated for each new application.

An object of the present invention is to provide a structure in which the tap weights of a transversal filter can be programmed by associated digital apparatus.

Another object of the present invention is to provide a charge splitting device which permits a charge packet to be repetitively divided in half, with one half being delivered to either of two possible outputs, while the other half is retained for further splitting.

A further object of the present invention is to provide a filter architecture in which charge packets are programmably split at each stage, with the split portions being separately sensed in an additive manner, such that the packets can be recombined and passed to the next stage thereby to implement a transversal filter.

In carrying out the invention in one embodiment in which a sample of a signal represented by a quantity of charge is multiplied by a factor represented by a pair of complementary digital words there is provided a substate of semiconductor material of one conductivity type. Means are provided for forming a first charge storage region of generally elongated outline in the substrate including a first storage electrode of generally elongated outline insulatingly overlying the first storage region. Means are provided for forming a second charge storage region of generally elongated outline in the substrate including a second storage electrode of generally elongated outline insulatingly overlying the second storage region. Means are provided for forming a barrier region of generally elongated outline in the substrate including a barrier electrode of generally elongated outline insulatingly overlying the barrier region, one long side of the barrier region being contiguous to a long side of the first storage region, the other long side of the barrier region being contiguous to a long side of the second storage region. The dimensions of the first storage region and the second storage region are preset whereby when the potential of the barrier region is of one value which permits the flow of charge therethrough, charge in the first storage region flows into the second storage region and equilibrates with the charge in the first storage region and when the potential of the barrier region is of another value which blocks the flow of charge therethrough the total charge is split into two equal parts, one part contained in the first storage region and the other part contained in the second storage region.

Means are provided for forming a first accumulator region of generally elongated outline in the substrate including a first accumulator electrode of generally elongated outline insulatingly overlying the first accumulator region. Means are provided for forming a second accumulator region of generally elongated outline in the substrate including a second accumulator electrode of generally elongated outline insulatingly overlying the second accumulator region. Means are provided for forming a first transfer region of generally elongated outline in the substrate including a first transfer electrode of generally elongated outline insulatingly overlying the first transfer region, the first transfer region having a width equal to substantially one-half of the width of the second storage region. One side of said first transfer region is contiguous with the other side of the second storage region. The other side of said first transfer region is contiguous with one side of the first accumulator region. Means are provided for forming a second transfer region of generally elongated outline in the substrate including a second transfer electrode of generally elongated outline overlying the second transfer region, the second transfer region having a width equal to substantially one-half of the width of the second storage region. One side of said second transfer region is contiguous with other side of the second storage region. The other side of the second transfer region is contiguous with the one side of the second accumulator region.

A first quantity of charge corresponding to a sample of a signal is provided. Introducing means are provided for introducing the quantity of charge into said first charge storage region. Means are provided for successively dividing a predetermined number of times the quantity of charge into first and second predetermined parts, each succeeding second part being at least one-half the preceding second part, each second part being contained in the second storage region. A pair of control words are provided of the same predetermined number of bits equal in number to the predetermined times of division corresponding bits of the words being complementary. Means are provided for applying successive bits of one word starting with the most significant bit to the first transfer electrode in synchronism with the presence of the second parts of charge in said second storage region. Means are provided for applying successive bits of the other of the words starting with the most significant bit to the second transfer electrode in synchronism with the presence of the second parts of charge in said second storage region. A bit of one value producing a signal of one kind applied to the transfer regions enables the transer regions to pass charge therethrough and a complement of the bit of one value producing a signal of a different kind applied to said transfer regions inhibits the transfer regions from passing charge therethrough, whereby each of the second parts of charge is passed to one or the other of the first and second accumulator regions. The words are jointly coded to provide an ultimate predetermined ratio of charge stored in the first and second accumulator regions. Means are provided for sensing the charge stored in each of the first and second accumulator regions and deriving a signal corresponding to the difference of the stored charges. The derived signal represents the multiplication of the quantity of charge by the aforementioned predetermined ratio.

The features which are believed to be characteristic of the present invention are set forth with particularity in the appended claims. The invention itself, both as to its organization and method of operation, together with further objects and advantages thereof may best be understood by reference to the following description taken in connection with the accompanying drawings in which:

FIGS. 5A-5Q are diagrams of voltage versus time occurring at various points in the apparatus of FIG. 1.

Figure 1:
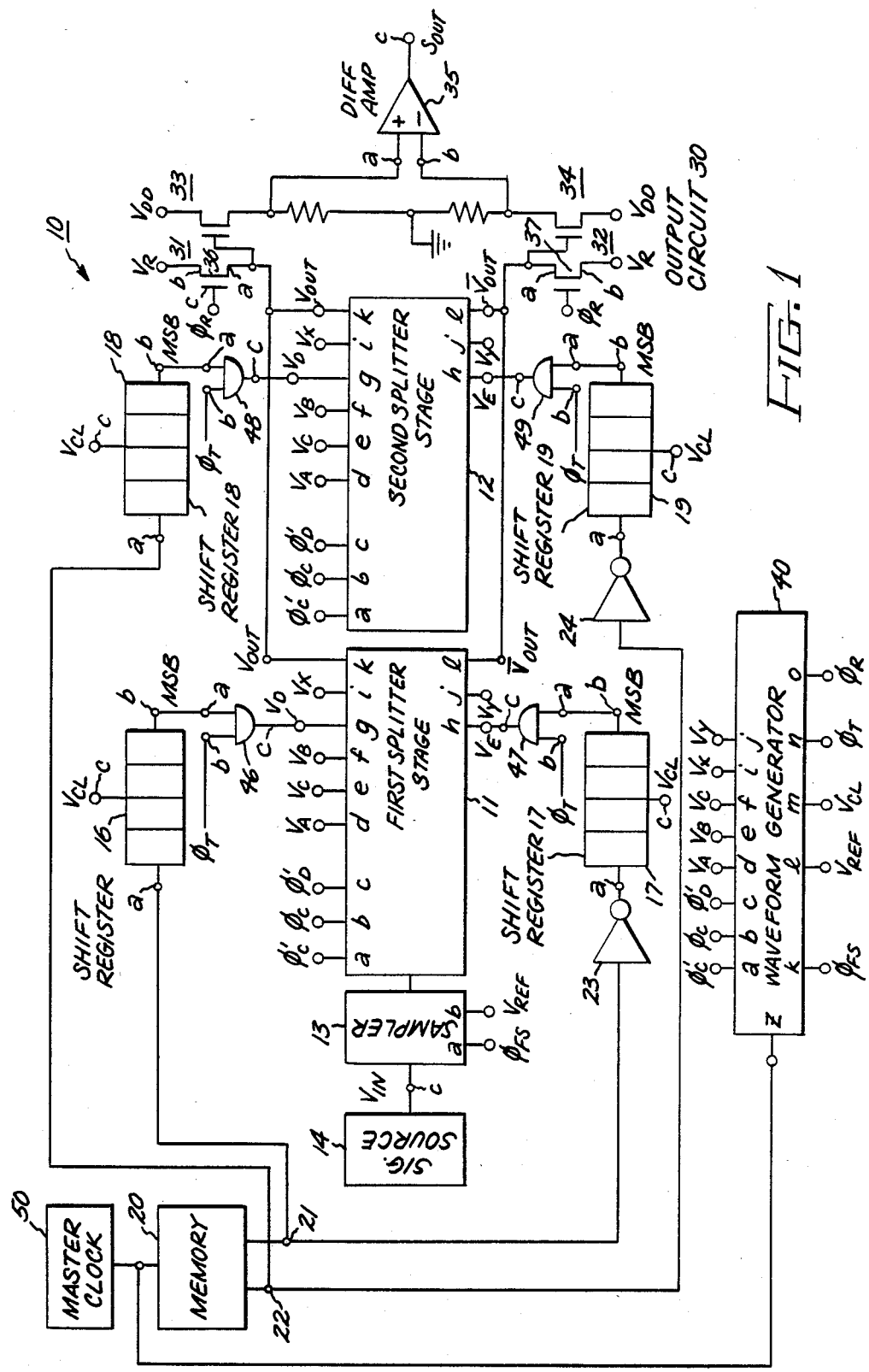
FIG. 1 is a block diagram of signal processing apparatus in accordance with an embodiment of the present invention.

Reference is now made to FIG. 1 which shows multiplying apparatus 10 for multiplying each of successive samples of an analog signal with a series of multiplying coefficients each having a value between +1 and −1, and each coded in the form of a pair of words corresponding bits of which are complementary. The apparatus includes a plurality of charge splitting stages 11 and 12, only two of which are shown for reasons of simplicity in describing the apparatus and explaining the operation thereof. The apparatus also includes a sampler 13 for sampling an analog signal from signal source 14 and for providing a sequence of quantities of charge each representing a respective sample of the analog signal. The series of samples are provided in sequence to the first splitter stage 11. After a sample is processed in the first splitter stage it is clocked into the second splitter stage 12 where it again is processed and thereafter clocked into subsequent splitter cells and processed therein. The apparatus 10 also includes a plurality of pairs of shift registers, only two pairs of which are shown. The first pair comprises shift registers 16 and 17. The second pair comprises shift registers 18 and 19. The first pair of shift registers 16 and 17 is operatively associated with the first splitter stage 11. The second pair of shift registers 18 and 19 is operatively associated with the second splitter stage 12. A memory circuit 20 provides a plurality of words at its output terminal, each at a respective output terminal, only terminals 21 and 22 of which are shown as only two pairs of shift registers are shown in the apparatus of FIG. 1. The word obtained at terminal 21 is applied to shift register 16 and the word obtained at terminal 22 is applied to the shift register 18. The word obtained at terminal 21 is also applied through inverter 23 to shift register 17. The word obtained at terminal 22 is also applied through inverter 24 to shift register 19. The word applied to shift register 17 is the same as the word applied to shift register 16 except that the corresponding bits are complements of the bits of the word inserted into shift register 16. Similarly, the corresponding bits of the word applied to shift register 19 are the complements of the bits of the word applied to shift register 18. An output circuit 30 comprising reset amplifiers 31 and 32, signal amplifiers 33 and 34 and differential amplifier 35 is also provided. The output circuit 30 is operatively associated with the splitter stages 11 and 12. Voltage waveform generator 40 having a plurality of output terminals provides voltages to various electrodes of the sampler, the first and second splitter stages, the output circuit 30 and the shift registers 16-19. The timing of the voltage waveform generator 40 and the memory circuit 20 is under the control of the master clock timer 50.

Figure 2:
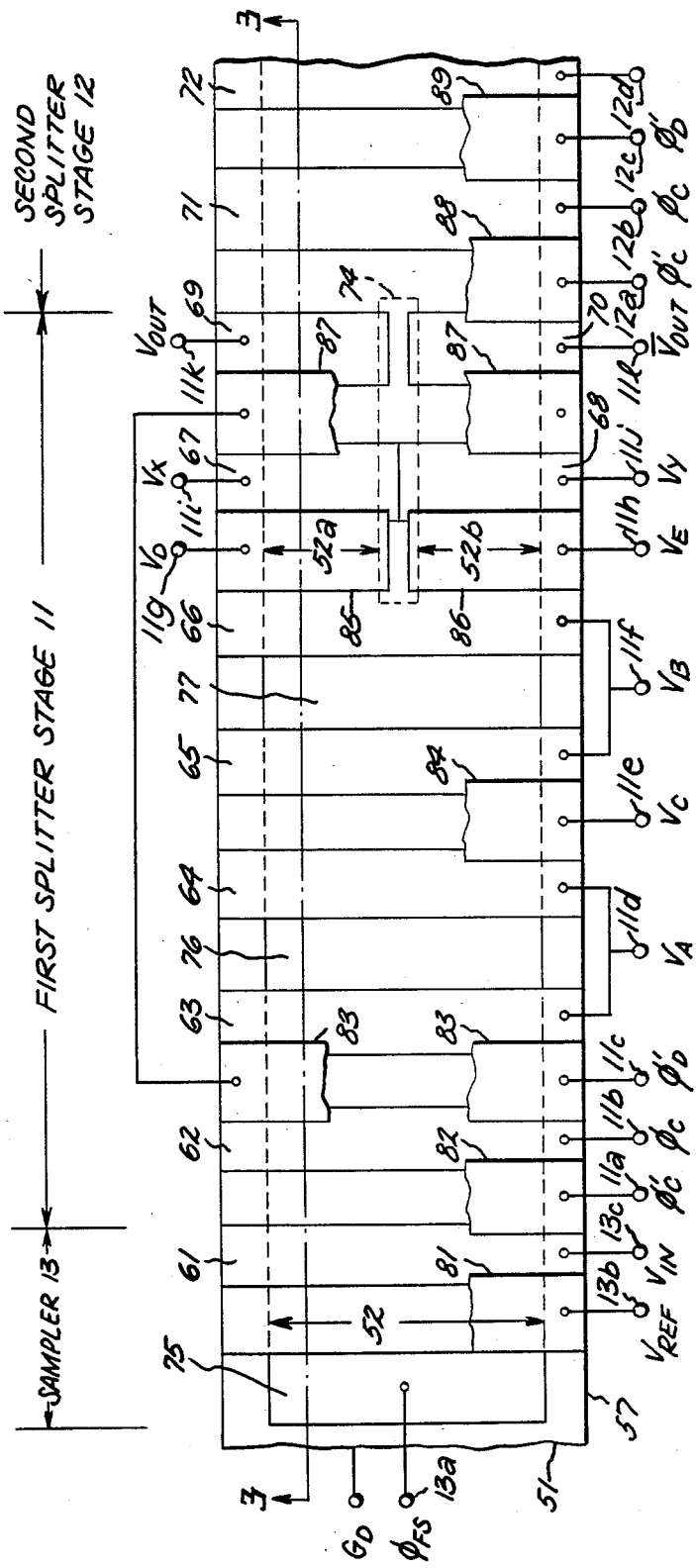
FIG. 2 is a plan view of the sampler and the splitter stages of the apparatus of FIG. 1.
Figure 3:
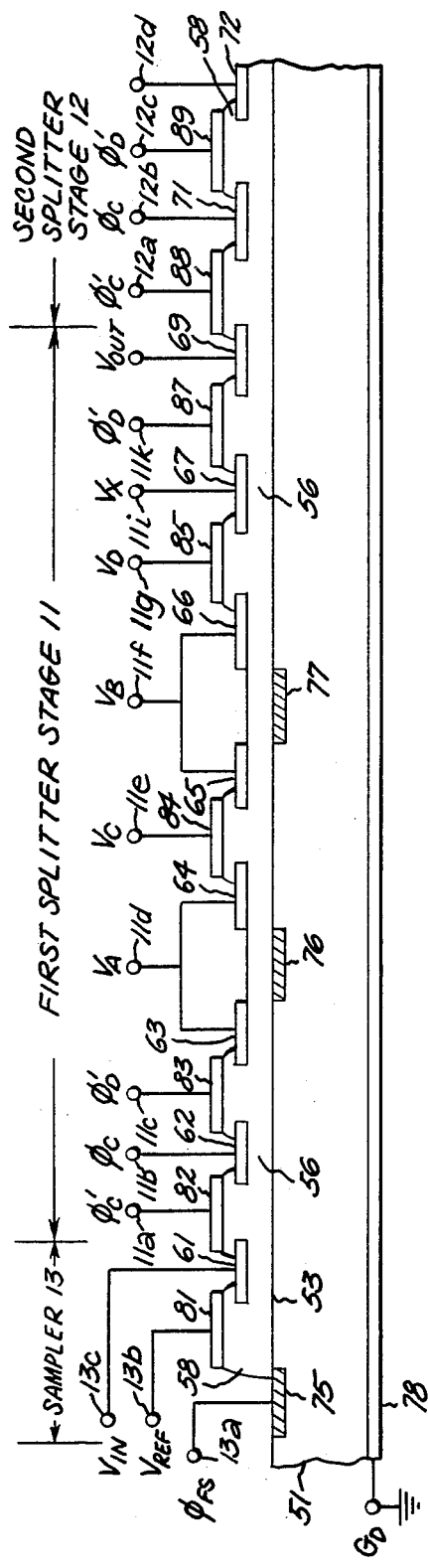
FIG. 3 is a sectional view of the assembly of FIG. 2 taken along section lines 3—3 thereof.
Figure 4:
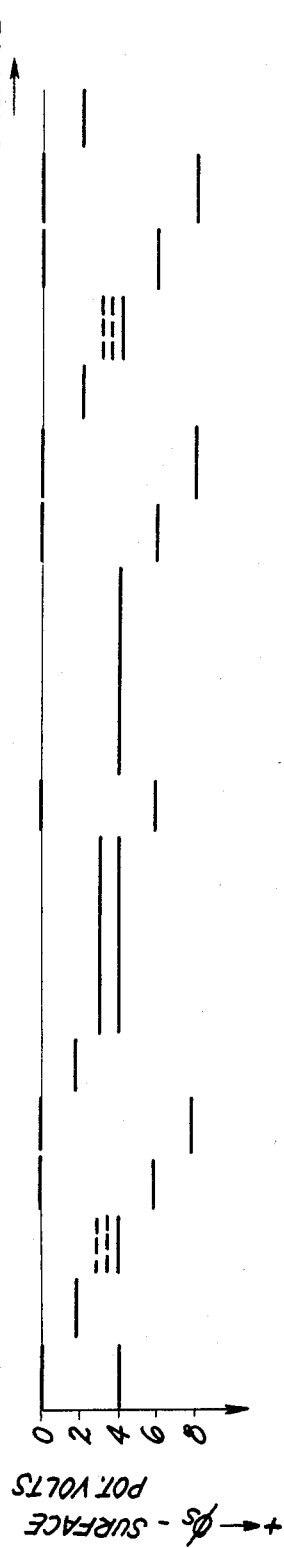
FIG. 4 is a diagram showing the values of surface potential occurring in the substrate underlying the various electrodes of the sampler and splitter stages of FIG. 2 during the operation thereof.

Reference is now made to FIGS. 2, 3 and 4 which show the sampler 13, and the first splitter stage 11 and a portion of the second splitter stage. The sampler and the first splitter stage 11 are formed on a common substrate 51 which has a channel portion 52 of uniform width adjacent the major surface 53 of the substrate. Typically, the substrate 51 may be silicon semiconductor material of 10 ohm cm. resistivity and P-type conductivity. Overlying the major surface of the substrate 51 is a thick insulating member 55 of silicon dioxide having a thin portion 56 which is of generally rectangular outline and lies in registry with the first channel portion 52 of the substrate.

A plurality of first level electrodes 61-72 are provided on insulating member 55 overlying thin portion 56 thereof and orthogonal to the length thereof. Each of the first level electrodes is of uniform length in the direction of the length of the semiconductor channel portion 52 and each of the first electrodes extends across the thin insulating portion 56 and the bordering thick insulating portions 57 of the insulating member 55 with exceptions to be noted. A thick block of silicon dioxide 74 is provided in the center of the channel 52 spaced between electrodes 66 and a point just beyond electrodes 69 and 70. The block 74 divides this portion of channel 52 into two channels 52a and 52b, for reasons which will be explained below. The electrodes 61 through 66 are equally spaced along the length of the channel 52. Electrodes 67 and 68 are located side by side with portions thereof overlying the thick oxide member 74, and are connected together. Electrodes 69 and 70 are arranged side by side. Electrode 69 overlying channel portion 52a and electrode 70 overlying channel portion 52b. Electrodes 71 and 72 are spaced beyond electrodes 69 and 70. A thin layer 58 of insulating material, such as silicon dioxide, is provided over the first level electrodes 61-72.

A plurality of second level electrodes 81-89 are provided over the insulating member 58 with each of the second level electrodes insulatingly spaced between adjacent first level electrodes. Each of the second level electrodes is of substantially uniform extent in the direction of the length of the channel portion and extends entirely over the insulating portion 57 of insulating member 55 as well as over the bordering thick insulating portions thereof with exceptions to be noted. Insulating members 85 and 86 are arranged side by side overlying respective channel portions 52a and 52b and having portions extending over the insulating block member 74. Terminals 13b, 13c, 11a, 11b, 11c, 11d, 11e, 11f, 11g, 11h, 11i, 11j, 11k, 11l, 12a, 12b, 12c, and 12d, are shown connected to respective electrodes 81, 62, 82, 62, 83, 63, 84, 65, 85, 86, 67, 68, 69, 70, 88, 71, 89, and 72. Adjacent each terminal voltages to be applied thereto are referenced. These applied voltages are obtained from waveform generator 40 and are shown in FIGS. 5A-5O. Charge packets are generated, stored, transferred and sensed in the storage regions and the transfer region underlying these electrodes. The various potentials of the surface of the channel portion of the substrate which occur at various times in the operation of the apparatus are shown in FIG. 4. Some of the electrodes are maintained at a fixed potential, others of the electrodes are varied between two levels of voltage to cause the surface potential of the semiconductor surface lying thereunder to change in accordance with the change in the applied potential. Since physical storage regions insulatingly underlying electrodes have a depletion capacitance, and a threshold voltage which is typically greater than zero, it is normally the case that the surface potntial is less than the actual voltage applied between the electrode and the substrate. The surface potential levels shown in FIG. 4 reflect this fact, and for sake of example, they are shown as being 2 volts below the applied potentials shown in FIG. 5. Regions 75. 76, and 77 of opposite conductivity type or N-type are formed in the channel regions of the substrate. The region 75 is contiguous to the region of the substrate underlying the electrode 81 and is connected to terminal 13a. Region 76 is contiguous to both the regions of the substrate underlying electrodes 63 and 64. Region 77 is contiguous to the regions of the substrate underlying electrodes 65 and 66. An electrode 78 is provided on the opposite surface of substrate 51 connected to ground.

The sampling stage comprises charge source region 75, voltage reference electrode 81 and input voltage electrode 61. With a fixed voltage supplied to reference electrode 81 a fixed value of surface potential is produced in the region underlying this electrode as shown in FIG. 4. With input voltage applied to the electrode 61, the surface potential established in the substrate underlying this electrode is more attractive to minority carriers than the surface potential underlying the reference electrode. With the voltage $\phi_{FS}$ applied to the region 75, a surface potential is established in this region allowing minority carriers in the form of electrons to flow through the region underlying the reference electrode into the region underlying the input electrode 61. After a time sufficient for equilibration, voltage $\phi_{FS}$ increases to a level such that region 75 becomes more attractive to minority carriers than the region underlying the reference electrode. As the voltage on the input electrode is greater than the voltage on the reference electrode, as shown in FIG. 4, charge flows into the storage region underlying electrode 61 leaving a quantity of charge therein proportional to the voltage input and represented by the difference in level of the surface potentials underlying the reference electrode 81 and the input electrode 61.

The $\phi_c'$ electrode 82, $\phi_c$ electrode 62 and $\phi_D'$ electrode 83 comprise a charge transfer substage. When the potential on $\phi_C'$ and $\phi_C$ electrodes are raised to the values indicated in FIG. 4. Charge in the storage region underlying electrode 61 flows into the storage region underlying $\phi_C$ electrode 62. When the potentials on electrodes 82 and 62 are lowered to establish zero surface potential underlying these electrodes, charge flows from the storage region underlying the $\phi_C$ electrode through the region underlying the $\phi_D'$ electrode, which is maintained at fixed potential, into the first storage region of the first splitter cell of the first stage 11. The first storage region is established by providing a fixed potential to electrodes 63 and 64 which will be referred to collectively as the first storage electrode. Region 76 of N-type conductivity contiguous to the storage regions underlying electrodes 63 and 64 provides high conductivity in the storage regions enabling the rapid equilibration of charge along the width of these storage regions. Electrode 84 constitutes a barrier electrode, the potential level thereof may be varied between a high and a low level. At low level the surface potential of the region underlying electrode 84 blocks the flow of charge out of the first storage region and at high level enables the transfer of charge through this barrier region into the second storage region underlying electrodes 65 and 66. As in the case of the first storage region, a region of N-type conductivity 77 contiguous to the storage regions underlying electrodes 65 and 66 enables the rapid lateral transfer of charge in the storage regions. The second storage region is made identical to the first storage region underlying electrodes 63 and 64 so that after a charge packet which has been introduced into the first storage region is allowed to partially flow into the second storage region by raising the potential underlying the electrode 84, thereby enabling the charges in the first and second storage regions to equilibrate, subsequent creation of a barrier between these two storage regions by lowering the potential of electrode 84 divides the packet of charge into two equal parts.

The region of the substrate underlying the first accumulator electrode 67 is designated as the first accumulator region and the region underlying the second accumulator electrode 68 is designated as the second accumulator region. These regions are separated in the substrate to provide for the accumulation of charge which may be directed to them as determined by the potential on the first transfer region underlying first transfer electrode 85 or the potential underlying the second transfer region underlying the second transfer electrode 86. Either one or the other of the electrodes 85 and 86 has a high potential applied thereto to lower the barrier in the transfer region underlying these electrodes to transfer charge from the second storage region underlying electrodes 65 and 66 to either the storage region underlying accumulator electrode 67 or the storage region underlying accumulator electrode 68. The voltages applied to these electrodes 85 and 86 are complementary. After a first split or division of the charge packet takes place and the divided part is directed to one of the two storage regions underlying accumulator electrodes 67 and 68, the packet of charge remaining in the first storage region underlying electrodes 63 and 64 is again split by lowering the potential of the barrier region underlying electrode 84 allowing the charge to flow into the second storage region underlying electrode 65 and 66 and equilibrate therewith. Thereafter, re-establishing a low voltage on electrode 84 re-establishes the barrier between the two storage regions and thus divides the remaining charge into two equal parts, one part of which is directed into one of the two storage regions underlying accumulator electrodes 67 and 68 determined by the voltage applied to the terminals 67 and 68. Operation of the next splitting cycle again splits the remainder portion in the first storage region and directs it into one of the two storage regions underlying accumulator electrodes 67 and 68. Thus, the first divided packet contained in the second storage region underlying electrodes 65 and 66 has a value of one-half, the second divided packet has a value of one-quarter, the third packet has a value of one-eighth. These divided packets are delivered to the storage regions underlying accumulator electrodes 67 and 68 as directed by the bits of the word and the inverse of the word controlling the potential applied to transfer electrodes 85 and 86. During the next cycle, the remainder portion of the charge representing one-eighth of the initial chare is clocked into one or the other of the storage regions underlying the electrodes 67 and 68. The difference in charge contained in these two storage regions represents the factor multiplying the charge packet, assuming the charge packet has a value of unity for the multiplication. By prearranging the make-up of the word and inverse word, this multiplying factor may be any value from $-1$ to $+1$, as desired. The packets in each of the storage regions are sensed by the output circuit 30 and a voltage is developed corresponding to the difference in magnitude of these two charge packets, as will be described below in connection with the operation of the apparatus in FIG. 1. After charge has been transferred to the regions underlying electrodes 69 and 70 for sensing and after sensing, the charges are transferred through the transfer substage including electrodes 88, 71 and 89 of the second splitter stage 12 to the first storage region underlying electrode 72 of the second splitter stage. The transferred charge undergoes a processing operation the same as the processing operation in the first splitter cell except in response to a different pair of processing words. In the meantime, a second sample of charge has been developed by the sampling stage 13 and transferred to the first storage region of the first splitter stage 11 where it is processed in accordance with the pair of words that were utilized to process the first charge packet or sample and provide an output representing the product of the charge sample and the weighting factor represented by the same complementary words which have been reinserted into the shift registers 16 and 17.

Referring now to FIG. 1, shift register 16 has input terminal 16a, output terminal 16b which is connected to the stage having the most significant bit of the word stored therein, and clocking terminal 16c. Shift register 17 has input terminal 17a, output terminal 17b which is connected to the stage having the most significant bit stored therein, and a clocking terminal 17c. Shift register 18 includes an input terminal 18a, an output terminal 18b which is connected to the stage having the most significant bit of the word stored therein, and the clocking terminal 18c. The shift register 19 includes an input terminal 19a, an output terminal 19b which is connected to the stage having the most significant bit of the word stored therein, and a clocking terminal 19c. The apparatus of FIG. 1 also includes AND gate 46 having input terminals 46a, 46b and an output terminal 46c, AND gate 47 having input terminals 47a and 47b and an output terminal 47c, AND gate 48 having input terminals 48a and 48b and an output terminal 48c, and an AND gate 49 having terminals 49a and 49b and output terminal 49c. Terminal 16a is connected to terminal 21 of the memory 20. Terminal 16b is connected to terminal 46a of AND gate 46. Output terminal 46c is connected to terminal 11g of the first splitter stage 11. Input terminal 18a of shift register 18 is connected to input terminal 22 of memory 20. Terminal 18b is connected to terminal 48a of AND gate terminal 48. Output terminal 48c is connected to terminal 12g of second splitter stage 12. Input terminal 17a of shift register 17 is connected to the output terminal of inverter 23. The input terminal of inverter 23 is connected to terminal 21 of memory 20. The output terminal 17b is connected to the input terminal 47a of AND gate 47. The output terminal 47c is connected to terminal 11h of splitter stage 11. Input terminal 19a of shift register 19 is connected to the output terminal of inverter 24. Input terminal of inverter 24 is connected to terminal 22 of memory 20. Output terminal 19b is connected to the input terminal 49a of AND gate 49. Output terminal 49c is connected to terminal 12h of splitter stage 12.

The voltage waveform generator 40 has an input terminal 40z connected to master timer 15 and output terminals 40a, 40b, 40c, 40d, 40e, 40f, 40i, 40j, 40k, 40l, 40m, 40n and 40o. The voltages appearing at these terminals are designated, respectively, $\phi_C'$, $\phi_C$, $\phi_D'$, $V_A$, $V_B$, $V_C$, $V_X$, $V_Y$, $\phi_{FS}$, $V_{REF}$, $V_{CL}$, $\phi_T$ and $\phi_R$. These voltages are shown respectively in FIGS. 5A, 5B, 5C, 5D, 5E, 5F, 5I, 5I, 5K, 5L, 5M, 5P and 5J. Terminals 40a–40f are connected to terminals 11a–11f of first splitter cell 11 and also to terminals 12a–12f, respectively, of second splitter cell 12. Terminals 40i and 40j are connected to terminals 11i and 11j of cell 11 and also to terminals 12i and 12j of cell 12. Terminal 40k is connected to terminal 13a of sampler 13. Terminal 40l is connected to terminal 13b. Terminal 40m is connected to terminals 16c, 17c, 18c and 19c of shift registers 16, 17, 18 and 19. Terminal 40n is connected to terminals 46b, 48b, 47b an 49b of AND gates 46, 47, 48 and 49.

The reset circuit 31 includes a transistor 36 having a source 36a, a drain 36b and a gate 36c. The source 36a is connected to terminals 11k and 12k of splitter stages 11 and 12. The drain 36b is connected to a source of reset potential $V_R$. The gate 36c is connected to terminal 40o of waveform generator 40 at which reset voltage $\phi_R$ appears. The reset circuit 32 includes a transistor 37 having a source 37a, a drain 37b and a gate 37c. The source 37a is connected to terminals 11l and 12l. The drain is connected to $V_R$ a source of reset potential. The gate 37c is connected to terminal 40o which provides reset voltage $\phi_R$. The source 36a is also connected to the gate of amplifier 33 and the source 37a is connected to the gate of amplifier 34. The output of the amplifier 33 is applied to noniverting terminal 35a of differential amplifier 35. The output of amplifier 34 is applied to the inverting terminal 35b of differential amplifier 35. An output $S_{out}$ is provided at output terminal 35c of the differential amplifier 35.

A single cycle of operation of the first splitter stage 11 of the apparatus of FIG. 1 will now be described referring to FIGS. 2, 3, 4 and 5A–5Q. It is assumed that three splitting operations will be performed in the first splitting stage thus forming from a packet charge supplied to the first splitter stage packets of value one-half, one-quarter, one eighth and a remainder packet of value one-eighth. The weighting factor of the first splitter stage has been set at two-eighths. Accordingly, the packets of one-half value and one-eighth value would have to be directed to the accumulator region underlying electrode 67 and the packet of value one-fourth and the remainder packet of value one-eighth would have to be directed into the accumulator region underlying electrode 68. If the packets stored in these accumulator regions are sensed and the difference of these two packets obtained, a resulting signal would be obtained which is proportional to two-eighths of the original signal, as desired. To achieve this result, the word inserted in the shift register 16 is 1010 with the most significant bit directing the transfer of the packet of one-half value to the accumulator region 67 underlying electrode 67 and also directing the transfer of third fractional portion of the original packet to the accumulator region underlying electrode 67. The inverse of the word supplied to shift register 16 would be inserted in the shift register 17 and would be 0101. Thus, the second fractional portion and the remainder portion would be directed to the accumulator region underlying electrode 68.

During a first period $P_1$, the potential on the region 75, is 4 volts and the potential on the surface region underlying the reference electrode 81 is 2 volts. Accordingly, no charge can flow from the region 75 through the region underlying electrode 81. During period $P_2$, potential of the region 75 is lowered to 0 volts thereby enabling minority carrier charge in the form of electrons to flow through the reference region underlying reference electrode 81 into storage region underlying electrode 61. The potential at the surface of the region underlying electrode 61 is dependent on the voltage applied to electrode 61. This voltage can vary from 4 to 6 volts producing a corresponding change in surface potential in the region underlying this electrode of 2 to 4 volts. The voltage appearing during time period $P_3$ is at some intermediate value, for example, 3 volts. Thus, the charge which has flowed into this region spills out of this region until the surface potential of this region equilibrates with the surface potential of 2 volts underlying electrode 81. The quantity of charge contained in this region represents a sample of the input signal at this time. During the interval $P_4$ and $P_5$, the voltage on the electrodes 82 and 62 is raised thereby enabling the packet of charge in the potential well underlying electrode 61 to flow into the potential well underlying the electrode 62. During the time interval $P_6$ potential on electrodes 82 and 62 is lower thereby enabling the charge to be transferred to the first storage region underlying the electrodes 63 and 64. The charge packet also flows into the second storage region underlying the storage electrodes 65 and 66 as the voltage on the barrier electrode 84 is at its high value of 8 volts. During the time periods $P_7$–$P_9$, the voltage on electrode 84 is lowered splitting the packet contained in the first and second storage regions into two equal parts. One half of the packet is contained in the first storage region underlying electrodes 63 and 64 and the other half of the packet is contained in the second storage region underlying the electrodes 65 and 66. During time period $P_8$, a pulse obtained from the output of the AND gate 46 is applied to electrode 85 and no pulse is applied from AND gate 47 to electrode 86. Thus, the split packet is directed into the storage region underlying the electrode 67. During the period $P_{10}$, the potential on the barrier gate 84 is raised to 8 volts thereby allowing the packet of value one-half of the original packet to partially flow into the second storage region underlying the electrodes 65 and 66 where it is split after equilibration upon lowering of the potential of the region underlying the barrier gate 84 during time period $P_{11}$. This packet one-fourth the size of the original packet is directed into the storage region underlying the electrode 68 as the potential applied to electrode 86 of the splitter stage 11 from the AND gate 47 raises the surface potential of the transfer region underlying this gate allowing the charge to flow into the storage region underlying the electrode 68. During the time period $P_{14}$, the potential on the barrier gate 84 is again raised and then lowered during the time interval $P_{16}$ to cause the packet of one-quarter the size of the original packet to be split into two packets, each one-eighth the size of the original packet, one contained in the storage region underlying electrodes 63 and 64 and the other packet contained in the second storage region underlying the electrodes 65 and 66. During period $P_{16}$, transfer gate 85 is actuated and the transfer gate 86 remains unactuated. Accordingly, this packet flows into the storage region underlying the electrodes 67. During the time period $P_{17}$, the potential on the barrier gate 84 is raised to 8 volts. Also during time period $P_{17}$, the potential on the first storage electrodes 63 and 64 is lowered from 6 to 5 volts causing the entire remaining charge packet to flow into the second storage region underlying the electrodes 65 and 66. When the barrier underlying the transfer gate 86 is lowered during time interval $P_{20}$, this charge flows into the storage region underlying the electrode 68.

The manner in which the transfer voltages $V_D$ and $V_E$ of FIGS. 5G and 5H applied to electrodes 85 and 86 are derived for controlling the channeling of charge into the source region underlying the electrode 67 and the electrode 68 of the first splitter stage will be described in connection with FIGS. 5M, 5N, 5O and 5P. During the time intervals, $P_{10}$, $P_{14}$ and $P_{18}$ and $P_{22}$ clocking pulses are applied to shift registers 16 and 17. Bits stored in the shift register 16 at period $P_9$ starting with the most significant bit first are 1010. Also, bits stored in the shift register 17 at this time starting with the most significant bit are 0101. The successive clocking of the shift register 16 produces the waveform shown in FIG. 5N where up until the period $P_9$ a "one" corresponding to the high level appears at the output terminal 16b. The output changes to low, high, low and high in response to the clocking pulses of FIG. 5M. Similarly, during the time interval $P_9$, the levels appearing at the output terminal 17b are low. During subsequent clocking by the pulses of FIG. 5M, the output shifts to high, low, high and low. The output waveforms shown in FIG. 5N and in 5O are "anded" with the waveform $\phi_T$ shown in FIG. 5P in the AND gates 46 and 47 to produce the waveform $V_D$ as shown in FIG. 5G and the waveform $V_E$ shown in FIG. 5H.

During the period $P_{20}$, a reset voltage $\phi_R$ is applied to the gates of reset transistors 36 and 37. The voltage on electrodes 69 and 70 is 6 volts and sets the surface potential on the regions underlying these electrodes at time interval $P_{21}$. The potential on the electrodes 67 and 68 is lowered to 0 volts thereby enabling the charge stored in the regions underlying these electrodes to flow into the storage regions underlying the electrodes 69 and 70 (FIG. 5Q) causing the potential thereof to change. These changes in potential appearing on the source electrodes 36a and 37a are applied to the output amplifiers 33 and 34 and then to differential amplifier 35 which provides at its output terminal 35c a voltage corresponding to the difference in these two values of charge. Thus, by the cycle of operation described, a sample of an analog signal has been multiplied by a weighting factor of one-fourth. During the next cycle of operation, periods $P_{22}$ through $P_{43}$, the packets of charge underlying electrodes 69 and 70 are combined and transferred to the first storage region of the second splitter stage 12 where it undergoes processing similar to the processing in the first splitter stage 11. Of course, the weighting factor would be different as represented by the pair of complementary words cycled through the shift registers 18 and 19. In the meantime, a second sample of the analog signal is obtained by the sampler 13, and passed into the first splitter stage where the same sequence of operations occur as described in the first cycle except that now they are performed on a different packet of charge. During the third cycle of operation, the second packet of charge is passed on to the second splitter stage 12. In the meantime, the charge packet that was processed in the second splitter stage is passed on to the next splitter stage (not shown). During these operations, the words in the shift registers 16 and 17 are essentially recycled. Also, the words in the second shift registers 18 and 19 are recycled. Thus, the weighting factors associated with the first splitter cell is fixed, the weighting factor associated with the second splitter cell is fixed and so on, while only the packet of charge undergoing the splitting operation is moved from one splitter cell to the next splitter cell. All of the outputs of electrode 69 of all of the stage are added and appear at the noninverting terminal of the differential amlifier 35 and all of the outputs at electrode 70 of all of the stages are added and appear at the inverting terminal of the differential amplifier 35. Thus, the output $S_{out}$ apparing at the terminal 35c of output amplifier 35 may be represented by the following equation:

$$S_{out}(t_m) = \sum_{n+1}^{N} h_n V_{in}(t_m - nT_c),\qquad(1)$$

where $V_{in}(t_j)$ represents the input signal at the $j^{th}$ sampling time, $t_m$ represents time of the $m^{th}$ sample, $T_c$ represents the period of clocking of charge samples from one stage to the next stage, n represents the stage number, N represents the total number of stages, and $h_n$ represents the weighting factor of the $n^{th}$ stage.

While in the apparatus of FIG. 1 only two splitter stages were shown, it will be understood that any number of such splitter stages with corresponding pairs of shift registers may be used, as desired.

While a pair of four bit words provided the weighting factor, word of a larger number of bits can be utilized to provide weighting factors of higher resolution, as desired.

While the filter of FIGS. 1, 2 and 3 has utilized charge transfer devices in which charge storage and transfer occurs in cells adjacent the surface of the semiconductor substrate, the present invention may be implemented with cells of opposite conductivity type regions. Structures of this type, commonly referred to as buried channel charge transfer devices, described in U.S. Pat. No. 3,902,187, assigned to the assignee of the present invention and incorporated herein by reference thereto. In such buried channel charge transfer devices charge storage and transfer occurs in cells below the surface of the semiconductor substrate. Implementation of prior art charge transfer filters with buried channel devices has particular advantages with respect to high speed operation, but suffers from nonlinearities resulting from the variable capacitance between the charge storage cells and their associated overlying electrodes.

While in the embodiment shown, the charge was divided into two equal parts, it is apparent that other division ratios, could be implemented. As long as the first part is larger than the second part, any coefficient between −1 and 1 can be implemented. An unequal division ratio may be desired in order to assure that splitting ratios near 0.5 can be attained.

While the invention has been described in a specific embodiment, it will be understood that modifications, such as those described above, may be made by those skilled in the art, and it is intended by the appended claims to cover all such modifications and changes as fall within the true spirit and scope of the invention.

What is claimed is:

1. A multiplying cell for multiplying a sample of a signal represented by a quantity of charge by a factor represented by a pair of complementary digital words comprising:

a substrate of semiconductor material of one conductivity type;

means for forming a first charge storage region of generally elongated outline in said substrate including a first storage electrode of generally elongated outline insulatingly overlying said first storage region, means for forming second charge storage region of generally elongated outline in said substrate including a second storage electrode of generally elongated outline insulatingly overlying said second storage region, means for forming a barrier region of generally elongated outline in said substrate including a barrier electrode of generally elongated outline insulatingly overlying said barrier region, one long side of said barrier region being contiguous to a long side of said first storage region, the other long side of said barrier region being contiguous to a long side of said second storage region, the dimensions of said first storage region and said second storage region being preset whereby when the potential of said barrier region is of one value which permits the flow of charge therethrough, charge in said first storage region flows into said second storage region and equilibrates with the charge in said first storage region and when the potential of said barrier region is of another value which blocks the flow of charge therethrough the total charge is split into two predetermined parts, one part contained in said first storage region and the other part contained in said second storage region, means for forming a first accumulator region of generally elongated outline in said substrate including a first accumulator electrode of generally elongated outline insulatingly overlying said first accumulator region, means for forming a second accumulator region of generally elongated outline in said substrate including a second accumulator electrode of generally elongated outline insulatingly overlying said second accumulator region, means for forming a first transfer region of generally elongated outline in said substrate including a first transfer electrode of generally elongated outline overlying said first transfer region, said first transfer region having a width equal to substantially one-half of the width of said second storage region, one side of said first transfer region being contiguous with the other side of said second storage region, the other side of said first transfer region being contiguous with one side of said first accumulator region, means for forming a second transfer region of generally elongated outline in said substrate including a second transfer electrode of generally elongated outline overlying said second transfer region, said second transfer region having a width equal to substantially one-half of the width of said second storage region, one side of said second transfer region being contiguous with the other side of said second storage region, the other side of said second transfer region being contiguous with one side of said second accumulator region, means for providing a first quantity of charge corresponding to a sample of a signal, introducing means for introducing said quantity of charge into said first charge storage region, means for successively dividing a predetermined number of times said quantity of charge into first and second predetermined parts, each succeeding second part being at least one-half the preceding second part, said second parts being contained in said second storage regions, means for providing a pair of control words of the same predetermined number of bits equal in number to said predetermined times of division, corresponding bits of said words being complementary, means for applying successive bits of one word starting with the most significant bit to said first transfer electrode in synchronism with the presence of said second parts of charge in said second storage region, means for applying successive bits of the other of said words starting with the most significant bit to said second transfer electrode in synchronism with the presence of said second quantities of charge, a bit of one value producing a signal of one kind applied to said transfer regions enabling said transfer regions to pass charge therethrough and a complement of said bit of one value producing a signal of a different kind applied to said transfer regions inhibiting said transfer regions from passing charge therethrough, whereby each of said second parts of charge is passed to one or the other of said first and second accumulator regions, said words being jointly coded to provide an ultimate predetermined ratio of charge stored in said first and second accumulator regions, means for sensing the charge stored in each of said first and second accumulator regions, and deriving a signal corresponding to the difference of said stored charges, said signal representing the multiplication of said quantity of charge by said predetermined ratio.

2. The multiplying cell of claim 1 in which said dividing means divides said quantity of charge into first and second predetermined parts, each succeeding second part being at least one-half the preceding second part, and a remainder part constituting the last second part, said second parts being contained in said second storage region, and in which said control word providing means provides a pair of control words of the same predetermined number of bits equal in number to said predetermined times of division plus one, corresponding bits of said words being complementary.

3. The multiplying cell of claim 1 in which said first predetermined part and said second predetermined part of charge are equal.

4. In combination, a substrate of semiconductor material of one conductivity type;

means for forming a first charge storage region of generally elongated outline in said substrate including a first storage electrode of generally elongated outline insulatingly overlying said storage region, means for forming second charge storage region of generally elongated outline in said substrate including a second storage electrode of generally elongated outline insulatingly overlying said second storage region, means for forming a barrier region of generally elongated outline in said substrate including a barrier electrode of generally elongated outline insulatingly overlying said barrier region, one long side of said barrier region being contiguous to a long side of said first storage region, the other long side of said barrier region being contiguous to a long side of said second storage region, the dimensions of said first stoage region and said second storage region being preset whereby when the potential of said barrier region is of one value which permits the flow of charge therethrough, charge in said first storage region flows into said second storage region and equilibrates with the charge in said first storage region and when the potential of said barrier region is of another value which blocks the flow of charge therethrough the total charge is split into two predetermined parts, one part contained in said first storage region and the other part contained in said second storage region, means for forming a first accumulator region of generally elongated outline in said substrate including a first accumulator electrode of generally elongated outline insulatingly overlying said first accumulator region, means for forming a second accumulator region of generally elongated outline in said substrate including a second accumulator electrode of generally elongated outline insulatingly overlying said second accumulator region, means for forming a first transfer region of generally elongated outline in said substrate including a first transfer electrode of generally elongated outline overlying said first transfer region, said first transfer region having a width equal to substantially one-half of the width of said second storage region, one side of said first transfer region being contiguous with the other side of said second storage region, the other side of said first transfer region being contiguous with one side of said first accumulator region, means for forming a second transfer region of generally elongated outline in said substrate including a second transfer electrode of generally elongated outline overlying said second transfer region, said second transfer region having a width equal to substantially one-half of the width of said second storage region, one side of said second transfer region being contiguous with the other side of said second storage region, the other side of said second transfer region being contiguous with one side of said second accumulator region.

5. The combination of claim 4 in which said first storage region includes a region of opposite conductivity type extending along the width thereof and in which said second storage region includes a region of opposite conductivity type extending along the width thereof.

6. The combination of claim 4 in which said two predetermined parts of charge are equal.

7. A transversal filter comprising:

a substrate of semiconductor material of one conductivity type, a plurality of multiplying stages connected in series, each stage including:

means for forming a first charge storage region of generally elongated outline in said substrate including a first storage electrode of generally elongated outline insulatingly overying said first storage region, means for forming second charge storage region of generally elongated outline in said substrate including a second storage electrode of generally elongated outline insulatingly overlying said second storage region, means for forming a barrier region of generally elongated outline in said substrate including a barrier electrode of generally elongated outline insulatingly overlying said barrier region, one long side of said barrier region being contiguous to a long side of said first storage region, the other long side of said barrier region being contiguous to a long side of said second storage region, the dimensions of said first storage region and said second storage region being substantially the same whereby when the potential of said barrier region is of one value which permits the flow of charge therethrough, charge in said first storage region flows into said second storage region and equilibrates with the charge in said first storage region and when the potential of said barrier region is of another value whick blocks the flow of charge therethrough the total charge is split into two equal parts, one part contained in said first storage region and the other part contained in said second storage region, means for forming a first accumulator region of generally elongated outline in said substrate including a first accumulator electrode of generally elongated outline insulatingly overlying said first accumulator region, means for forming a second accumulator region of generally elongated outline in said substrate including a second accumulator electrode of generally elongated outline insulatingly overlying said second accumulator region, means for forming a first transfer region of generally elongated outline in said substrate including a first transfer electrode of generally elongated outline overlying said first transfer region, said first transfer region having a width equal to substantially one-half of the width of said second storage region, one side of said first transfer region being contiguous with the other side of said second storage region, the other side of said first transfer region being contiguous with one side of said first accumulator region, means for forming a second transfer region of generally elongated outline in said substrate including a second transfer electrode of generally elongated outline overlying said second transfer region, said second transfer region having a width equal to substantially one-half of the width of said second storage region, one side of said second transfer region being contiguous with the other side of said second storage region, the other side of said second transfer region being contiguous with one side of said second accumulator region, means for forming a plurality of packets of charge, each packet representing a respective sample of an analog signal, means for successively introducing each of said quantities of charge in sequence into the first storage regions of each of said multiplying sages, each of said multiplying stages including:

means for successively dividing a predetermined number of times a respective quantity of charge into first and second equal parts, each succeeding second part being one-half the preceding second part, and a remainder part constituting the last second part, said second parts being contained in said second storage region, means for providing a plurality of pairs of control words of the same predetermined number of bits equal in number to said predetermined times of division plus one, corresponding bits of said words being complementary, means for applying a signal in response to successive bits of one word of each of said pairs of words starting with the most significant bit to the first transfer electrode of a respective cell in synchronism with the presence of said second parts of charge in said second storage region, means for applying a signal in response to successive bits of the other of said words of each of said pairs of words starting with the most significant bit to said second transfer electrode of a respective cell in synchronism with the presence of said second parts of charge in said second storage region, a bit of one value providing a signal of one kind applied to said transfer regions enabling said transfer regions to pass charge therethrough and a complement of said bit of one value producing a signal of a different kind applied to said transfer regions inhibiting said transfer regions from passing charge therethrough, whereby each of said second parts is passed to one or the other of said first and second accumulator regions of a respective cell, each of said words being jointly coded to provide a respective ultimate predetermined ratio of charge stored in said first and second accumulator regions, means for sensing the sum of the charges stored in said first accumulator regions, means for sensing the sum of the charges stored in said second accumulator regions, and means for deriving a signal representing the difference in said sums of stored charges.

* * * * *